United States Patent [19]
Drost et al.

[11] Patent Number: 6,031,406
[45] Date of Patent: Feb. 29, 2000

[54] SINGLE RAIL REGULATOR

[75] Inventors: Robert J. Drost, Palo Alto; Robert J. Bosnyak, San Jose; Jose M. Cruz, Menlo Park, all of Calif.

[73] Assignee: Sun Microsystems, Inc., Palo Alto, Calif.

[21] Appl. No.: 08/883,524

[22] Filed: Jun. 26, 1997

[51] Int. Cl.$^7$ ............................. H03K 5/00; H01L 27/02
[52] U.S. Cl. ..................... 327/319; 327/552; 327/311; 327/551; 327/565; 257/503; 257/523
[58] Field of Search .................................. 327/551, 552, 327/311, 309, 319, 321, 565; 257/519, 552; 341/144

[56] References Cited

U.S. PATENT DOCUMENTS

| | | | |
|---|---|---|---|
| 4,847,672 | 7/1989 | Polhemus | 357/47 |
| 5,410,311 | 4/1995 | Doyle | 341/144 |
| 5,453,713 | 9/1995 | Tarovi et al. | 327/565 |

OTHER PUBLICATIONS

N. Verghese, T. Schmerbeck, D. Allstot, "Simulation Techniques and Solutions for Mixed–Signal Coupling in Integrated Circuits," Kluwer Academic Publishers, 1995, pp. 235–253.

*Primary Examiner*—Dinh Le
*Attorney, Agent, or Firm*—Skjerven, Morrill, MacPherson, Franklin & Friel, LLP; Stephen A. Terrile

[57] ABSTRACT

An apparatus for suppressing the effect of noise from a first circuit on the performance of a second circuit wherein the first and second circuits are on a common substrate. Each of the first and second circuits include first and second supply rails. The apparatus includes a noise isolation circuit and a noise transference circuit. The noise isolation circuit is for coupling the first supply rails of the first and second circuits to prevent noise on the first supply rail of the first circuit from transferring to the first supply rail of the second circuit. The noise transference circuit is for coupling the second supply rails of the first and second circuits so that noise on the second supply rail of the first circuit is transferred to the second supply rail of the second circuit.

27 Claims, 3 Drawing Sheets

Design Target: C1 > 100 • C2

SINGLE RAIL REGULATOR

BACKGROUND

1. Field of the Invention

The present invention relates to electronic circuitry, and, more particularly, to isolation and immunization of quiet circuitry from noise generated by noisy circuitry.

2. Description of the Related Art

Electronic circuit noise consists of undesirable signals which obscure desired circuit signals. Signals of interest in electronic circuits are often mixed with noise. Noise includes "random" noise of physical (often thermal) origin. For example, Johnson noise voltage is intrinsically generated by all resistors. A resistor may also include excess noise due to resistance fluctuations that produce a noise voltage in addition to the Johnson noise voltage. Such resistance fluctuations can differ based on the quality of the resistor.

Noise can also be another signal causing interference with the desired signal. Interfering signals can enter an electronic instrument through the power-line inputs or through signal input and output lines. In addition, signals can be capacitively coupled onto wires in the circuit, magnetically coupled to closed loops in the circuit, or electromagnetically coupled to wires acting as small antennas for electromagnetic radiation. Any of these can become a mechanism for coupling signals from one part of a circuit to another. Also, signal currents from one part of the circuit can couple to other parts through voltage drops on power supply lines.

Circuit noise limits the performance of electronic circuitry. Consequently, the suppression of the effects of noise by either isolation of circuit noise or immunization of circuits against the effects of noise is an important consideration in circuit and package design. The effect of noise in a circuit may be reduced by the use of various design techniques to reduce the noise generated by certain devices or circuits. The effect of noise in a circuit may also be reduced by the use of various layout techniques to isolate (e.g., with guard rings or shields) the sensitive circuits in question. Additionally, or alternatively, sensitive circuits may be immunized or made more tolerant to noise (e.g., by using differential circuitry). In difficult cases the solution may involve a combination of filtration of input and output lines, careful layout and grounding, and extensive electrostatic and magnetic shielding. Examples of noise suppression, isolation and immunization techniques may be found in N. Verghese, T. Schmerbeck, D. Allstot, Simulation Techniques and Solutions for Mixed-Signal Coupling in Integrated Circuits 235–253 (Kluwer Academic Publishers 1995) and in P. Horowitz, W. Hill, The Art of Electronics, pp. 430–466 (Cambridge University Press 1989).

Some types of noise, such as thermal noise in resistors and shot noise in transistors, is intrinsic to circuits including those elements. In mixed signal applications, however, digital switching and output driver noise often dominate such intrinsic noise. Digital switching noise reaches sensitive circuits via the substrate or via source or ground lines. Some systems are especially susceptible to digital switching noise. For example, communication applications (e.g., Ethernet or fiber channel) are especially susceptible to such noise, but analog-to-digital conversion, digital-to-analog conversion and analog audio processing applications (especially with switch capacitor filters) are also susceptible to such noise. Communications systems often include a sensitive clock recovery circuit or clock generation circuit that has tight jitter tolerances and the jitter may have a large dependence on noise that is on a power rail or in the substrate.

Consequently, an inexpensive, integrated method of digital noise effect suppression or immunization is desired for analog sections of mixed signal applications.

SUMMARY

It has been discovered that a single rail supply and substrate noise isolation system minimizes the effect of noise transmitted from noisy circuitry (e.g., digital circuitry) to quiet circuitry (e.g., analog circuitry). Such a single rail regulator provides the advantage, for example, that digital source rail voltage variations are isolated from the analog circuitry. Furthermore, digital ground rail voltage variations are transferred to both the analog source and ground rails of the analog circuit elements. Because all of the analog circuits receive substantially the same digital noise at substantially the same time, minimal differential voltage noise is detected by the analog circuits. A moat isolates the noise sensitive circuit from substrate noise. Thus, quiet circuitry is immunized and isolated from noise generated by a noisy circuit.

In one embodiment of the present invention, an apparatus suppresses the effect of noise from a first circuit on the performance of a second circuit. The first and second circuits are on a common substrate. Each of the first and second circuits include first and second supply rails. The apparatus includes a noise isolation circuit and a noise transference circuit. The noise isolation circuit is for coupling the first supply rails of the first and second circuits to prevent noise on the first supply rail of the first circuit from transferring to the first supply rail of the second circuit. The noise transference circuit is for coupling the second supply rails of the first and second circuits so that noise on the second supply rail of the first circuit is transferred to the second supply rail of the second circuit.

In another embodiment, a method is provided for suppressing the effect of noise on the performance of a circuit. The method includes providing a first circuit, a second circuit, a noise isolation circuit and a noise transference circuit on a common substrate. The noise isolation circuit couples a first supply rail of the first circuit and a first supply rail of the second circuit to prevent noise on the first supply rail of the first circuit from transferring to the first supply rail of the second circuit. The noise transference circuit couples a second supply rail of the first circuit and a second supply rail of the second circuits so that noise on the second supply rail of the first circuit is transferred to the second supply rail of the second circuit.

BRIEF DESCRIPTION OF THE DRAWINGS

The present invention may be better understood, and its numerous objects, features, and advantages made apparent to those skilled in the art by referencing the accompanying drawings. The use of the same reference symbols in different drawings indicates similar or identical items.

DETAILED DESCRIPTION

The following sets forth a detailed description of a preferred embodiment of the invention. The description is intended to be illustrative of the invention and should not be taken to be limiting. Many variations, modifications, additions, and improvements may fall within the scope of the invention as defined in the claims that follow.

In one embodiment of the invention, a single rail supply and substrate noise isolation system is provided to minimize the effect of digital noise on analog circuitry. The single rail regulator employs a constantly equivalent current, high effective resistance coupling of analog and digital source rails and a constantly equivalent voltage, low effective resistance coupling of analog and digital ground rails. In this way, voltage variations on the digital source rail are isolated from the analog source rail. Also, voltage variations on the digital ground rail are transferred to the analog ground rail and the analog source rail so that the digital noise is transferred to all of the circuit elements in the analog circuit. Because all of the analog circuits receive effectively the same digital noise at effectively the same time, minimal differential voltage noise is detected by the analog circuits.

Figure 1:
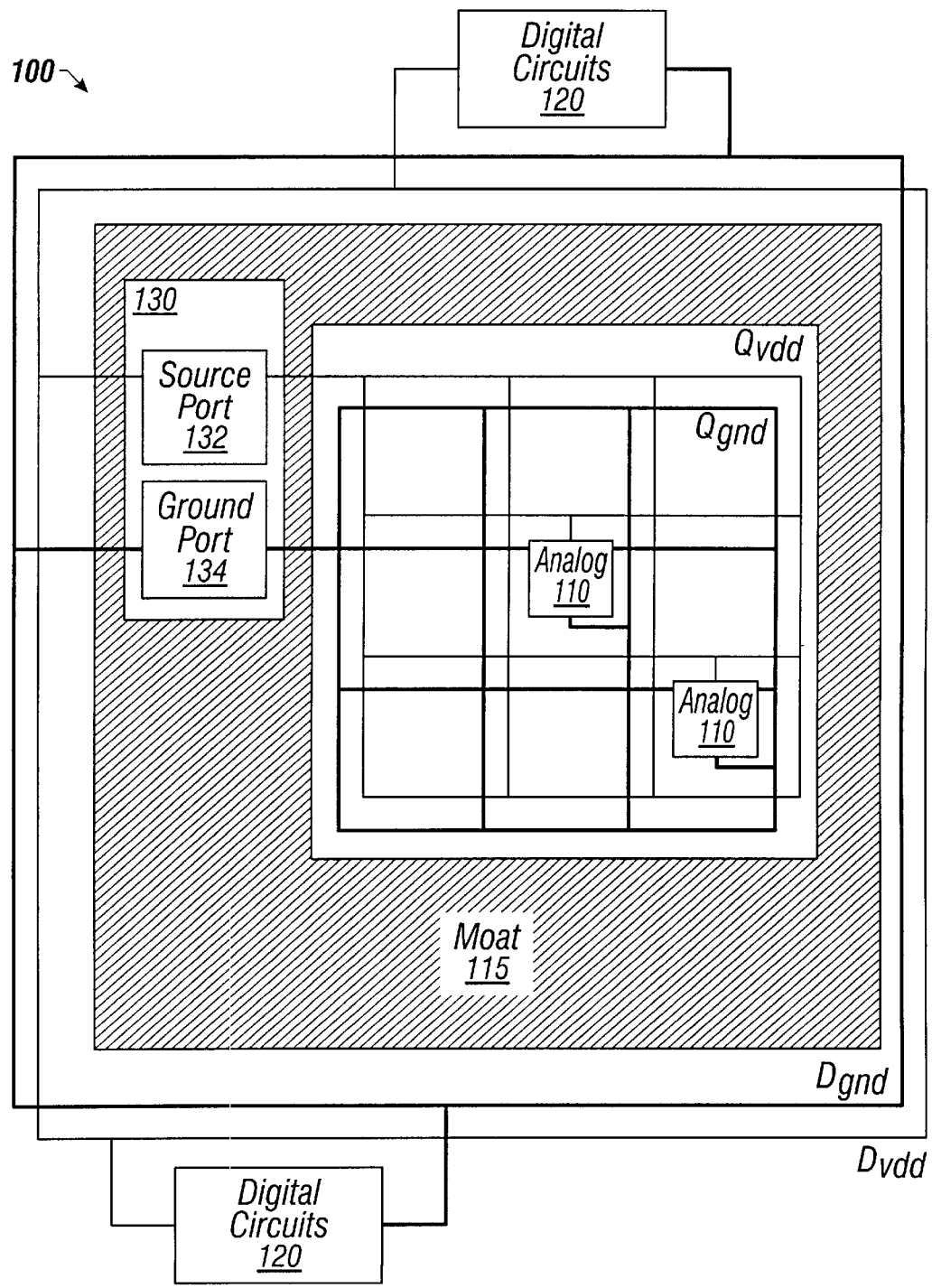
FIG. 1 shows a block diagram of a noise effect suppression system according to an embodiment of the invention.

FIG. 1 depicts an exemplary noise effect suppression system. Mixed signal circuit 100 includes analog circuits 110, digital circuits 120 and noise effect suppression circuit 130. In the embodiment of FIG. 1, analog circuits 110 are exemplary of quiet circuits, and digital circuits 120 are exemplary of noisy circuits due, for example, to digital switching noise. Analog circuits 110 are coupled between analog (quiet) source rail Qvdd and analog ground rail Qgnd. Digital circuits 120 are coupled between digital source rail Dvdd and digital ground rail Dgnd. Digital circuits 120 and analog circuits 110 are isolated from each other by impedance moat 115. Digital circuits 120 and analog circuits 110 are coupled only via noise effect suppression circuit 130. Noise effect suppression circuit 130 includes a source port 132 and a ground port 134. Qgnd is coupled to Dgnd via ground port 134. Qvdd is coupled to Dvdd via source port 132.

Figure 4:
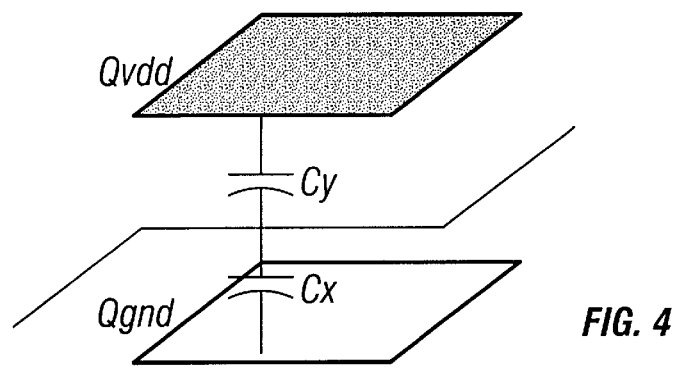
FIG. 4 shows a block diagram of capacitor dividers of analog circuits in a noise effect suppression system according to an embodiment of the invention.

Analog circuits 110 include quiet or noise sensitive circuitry. Specifically, in the embodiment of FIG. 1, analog circuits 110 can include, for example, any type of circuit in which the continuously variable magnitudes of the signals transmitted therewithin can represent informational content. All of the signals of analog circuits 110 capacitively terminate on either Qvdd or Qgnd. (See FIG. 4.) In one embodiment, Qgnd includes a grid of metal 1/substrate busing with substrate taps in the quiet ground area, and the Qvdd busing is metal 3. The distributed resistive/capacitive networks that constitute the power supply rails of mixed signal circuit 100 are referred to herein as rails and/or nodes. In the embodiment of mixed signal circuit 100, the supply rails/nodes are identified as Qvdd, Qgnd, Dvdd and Dgnd. The circuits described herein include interconnected active and/or passive electrical/electronic components or a subcombination or portion thereof. For example, a circuit may include a node through which current may pass or across which little or no voltage drop may occur.

Digital circuits 120 include circuitry that generates noise. Specifically, in the embodiment of FIG. 1, digital circuits 120 include any type of circuit which operates according to a switching protocol in which the informational values of the signals transmitted therewithin have only specific states (e.g., on/off, high/low, etc.). Such circuitry typically generates switching noise that can adversely impact analog circuitry in mixed signal systems.

The only supply connections between analog circuits 110 and digital circuits 120 across high impedance moat 115 are at source port 132 and ground port 134. In one embodiment, ground port 134 is a noise transference circuit which provides a low impedance metal connection between Qgnd and Dgnd, and source port 132 is a noise isolation circuit which provides a high dynamic impedance connection between Qvdd and Dvdd. Qgnd and Dgnd are coupled only at ground port 134 to minimize the amount of noise currents in the digital substrate which flow through the analog section.

Moat 115 provides a high impedance, low capacitance substrate barrier between the noisy and quiet circuits of mixed signal circuit 100. The high impedance characteristic of the moat is for minimizing the momentary effects due to movement of current in the substrate. Specifically, moat 115 provides a barrier between digital circuits 120 and analog circuits 110 to reduce spatial voltage variations or spatial noise flowing through the substrate. Excepting source and ground ports 132, 134, moat 115 provides a ring of high impedance around the quiet circuits. Thus, moat 115 provides a high impedance barrier between Qgnd and Dgnd, and a low capacitance barrier between Dvdd and Qvdd. Moat 115 can be any type of structure in or on a substrate having a resistance higher than the substrate and the connections between the quiet and noisy circuits. Moat 115 can be, for example, an n-well that is tied to one of Qvdd or Dvdd, or an "empty" untapped p-substrate, assuming an n-well silicon process.

Moat 115 has an impedance that is high relative to the metal connection at ground port 134. At the ideal limit where the moat substrate has infinite impedance, no currents on Dgnd can enter the analog Qgnd over the moat. In practice, little or no current enters the analog Qgnd over the moat because Qgnd has a single, low impedance connection to Dgnd at ground port 134. Even if the substrate includes a buried P+ layer, or an epitaxial layer on top of a P+ doped substrate, the metal 1 sheet resistance will be small compared to the substrate resistance. The ratio of the moat sheet resistance to the ground port sheet resistance indicates the quality of this approximation. For example, in one embodiment, if the moat's substrate resistance is 10 ohms/square and the ground port sheet resistance is 100 mohms/square and comparable squares connect the two paths then most of the noise currents will flow around the moat at a ratio of 100 to 1. In another embodiment, moat 115 has a resistance between 10–50 ohms, or more preferably 40–50 ohms, and the low impedance connection has a resistance of 1–2 ohms. Thus, the current is directed around the moat and spatial noise is prevented from affecting the quiet analog circuits 110. When the quiet ground bounces at one point, it bounces at all other points in the same way.

A noise effect larger than spatial substrate noise results from the large bond wire inductance which causes Dgnd to bounce to higher and lower voltages for relatively long periods of time (e.g., 2–3 ns) with a periodicity equal to the digital system clock. Thus the Dgnd supply rail acts more like a voltage noise source while ground currents in the substrate produce a second order noise as they flow around the chip looking to terminate their loop. The moat tries to minimize the second order current noise (but not the bond wire induced voltage noise) in order to make the ground currents look like an even less significant effect. The first order noise is reduced by the noise effect suppression circuitry. Thus, although the preferred embodiment includes moat 115, other embodiments may include other isolation means or no such isolation means.

Noise effect suppression circuit 130 minimizes the effect of digital switching noise coupling into sensitive analog circuit portions via ports 132, 134. Because the noise isolation function is located in noise effect suppression circuit 130, there is little or no need for a fundamental redesign of digital circuits 120 (to prevent the generation of noise) and of analog circuits 110 (to lessen the effect of such noise). Noise effect suppression circuit 130 includes active (e.g., transistor current source) and passive (e.g., resistor) isolation and/or transference structures and circuits between the digital and analog circuits. These structures and circuits attenuate the noise and the effects of noise on the power supply rails and in the substrate of the analog circuitry. Noise effect suppression circuit 130 is further described hereinafter.

Figure 2:
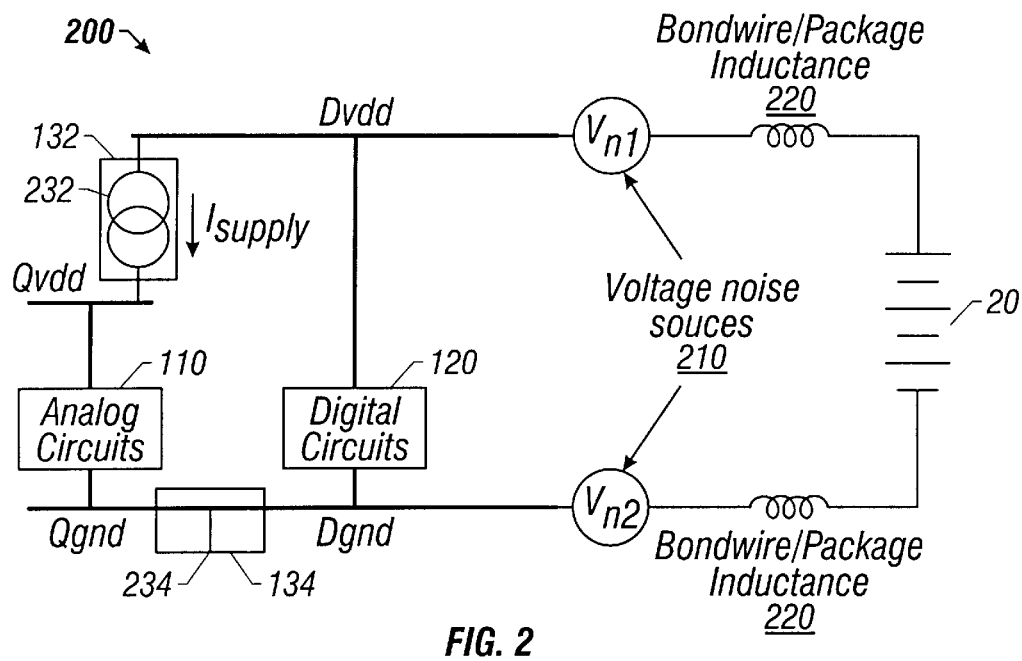
FIG. 2 shows a block diagram of a noise effect suppression system according to an embodiment of the invention.

FIG. 2 shows a lumped model of the noise effect suppression system of FIG. 1. The distributed resistive/capacitive networks that constitute each of the four power supply rails of mixed signal circuit 200 have been simplified to the four nodes Qvdd, Qgnd, Dvdd and Dgnd. This simplification may be made because the moat provides effective isolation. Mixed signal circuit 200 includes analog circuits 110 and digital circuits 120. Analog circuits 110 are coupled between source rail Qvdd and ground rail Qgnd. Digital circuits 120 are coupled between source rail Dvdd and ground rail Dgnd. Qvdd is coupled to Dvdd via source port 132. Qgnd is coupled to Dgnd via ground port 134. Digital switching noise is represented in mixed signal circuit 200 by voltage noise sources 210 and bondwire/package inductance noise sources 220. The source and ground rails are coupled to respective source and ground terminals of power supply 20. In the exemplary embodiment, source port 132 includes noise isolation circuit 232, and ground port 134 includes noise transference circuit 234. Specifically, in the embodiment of FIG. 2, noise isolation circuit 232 is a current source, and noise transference circuit is a low impedance wire connection. In other embodiments, ground port 134 includes noise isolation circuit 232 and supply port 132 includes noise transference circuit 234.

Ground port 134 provides the only connection between the analog ground rail Qgnd and the digital ground rail Dgnd. Noise transference circuit 234 of ground port 134 is a low impedance connection to ensure substantially equivalent voltages on the ground rails or nodes Qgnd and Dgnd. In one embodiment, ground port 134 is a low impedance metal wire or strap connecting the Qgnd rail to the Dgnd rail. In the preferred embodiment, the Qgnd and Dgnd voltages are substantially equivalent if Qgnd tracks disturbances on Dgnd within 98%, or even 95%, but greater or lesser tolerance of equivalence is possible depending on the sensitivity of the analog circuitry and the ability of other factors such as other means of noise isolation or immunization, discussed herewithin or otherwise, to compensate.

Source port 132 provides the only connection between the analog source rail Qvdd and the digital ground rail Dvdd. Noise isolation circuit 232 of source port 132 provides a substantially constant current from Dvdd to Qvdd to prevent current variation due to voltage fluctuations on any of the source or ground rails. Noise isolation circuit 232 provides the current Isupply from the noisy Dvdd rail to the relatively quiet Qvdd rail. Isupply is the average current drawn by the mostly current steering logic (to prevent noise generation) in analog circuits 110. In the preferred embodiment, Isupply is substantially constant if it has a variance less than 1–10% of its average value, but greater or lesser tolerance is possible depending on the sensitivity of the analog circuitry and the ability of other factors such as other means of noise isolation or immunization, discussed herewithin or otherwise, to compensate.

In one embodiment, noise isolation circuit 232 is a current source resistor. Such a resistor may be used in a small signal environment. However, a large resistor (large so that bounces in Dvdd produce small current changes) may provide too large of a voltage drop between Dvdd and Qvdd, and a small resistor may allow noise on Dvdd to change the current by a large amount and thus couple in noise. For example, if the analog section requires 10 mA, the resistor would have to have a value of 50 ohms to have less than a 0.5V droop between Dvdd and Qvdd. If the capacitance between Qvdd and Qgnd was around 5 pF, noise on Dvdd at a frequency below 4 GHz would flow barely attenuated through this RC (time constant of 0.25 nanoseconds) low pass filter.

In another embodiment, noise isolation circuit 232 is a current source which more fully regulates the current between the Qvdd and Dvdd rails. A P-channel metal-oxide semiconductor (PMOS) transistor can provide an effective, isolating current source with a Qvdd that is only 0.3–0.5 volts lower than Dvdd. In this embodiment, the PMOS transistor can be kept mostly in the saturated region, even with fluctuations of a few 100 mVs on both Qvdd and Dvdd.

The noise isolation circuit 232 of the noise effect suppression system of FIG. 2 prevents noise on the digital source rail Dvdd from reaching the analog source rail Qvdd and analog circuits 110. Noise on Dvdd caused by Vn1 is not seen by analog circuits 110 because the output current of noise isolation circuit 232 remains substantially constant when the voltage on the Dvdd rail varies. Thus, the noise does not reach the analog circuits.

The noise effect suppression system of FIG. 2 also prevents the analog circuitry from seeing any of the noise on the digital ground rail Dgnd caused by Vn2 even though substantially all of the Dgnd noise reaches analog circuits 110. The low resistance connection noise transference circuit 234 between Qgnd and Dgnd causes any Dgnd voltage variation due to noise to appear on Qgnd. Qvdd has a high dynamic impedance connection to Dvdd and a capacitive coupling to Qgnd (e.g., through signal wires, through the analog substrate, or through the specific capacitances connecting Qvdd to Qgnd). Therefore, all of the voltage variation on Qgnd also appears on Qvdd. Because all of analog signals of analog circuits 110 are capacitively terminated to Qvdd or Qgnd (see FIG. 4), the analog signals will also vary with Qgnd and Qvdd. And, because potentials are relative, no noise is seen from the points of view of the analog circuits. Thus, analog circuits 110 are immunized from the noise of digital circuits 120.

If there is some capacitive coupling between Dvdd and Dgnd, either of Vn1 and Vn2 will cause some noise on all rails simultaneously. However, due to the principle of superposition and the common nature of such noise, the analog circuitry is immune from the combined noise.

Thus, the noise effect suppression system of FIG. 2 maintains a constant current between the Dvdd and Qvdd rails, and a constant voltage (close to 0 volts) between the Qgnd and Dgnd rails. The constant current between the Dvdd and Qvdd rails prevents noise on the digital source rail Dvdd from reaching the analog source rail Qvdd. The constantly equivalent voltage on the Qgnd and Dgnd rails and the capacitive coupling of the Qgnd and Qvdd rails allow the noise on the digital ground rail Dgnd to be transferred to the Qgnd and Qvdd rails so that the noise is not seen by the circuitry of analog circuits 110 because the bounce on the ground and source rails is substantially the same. In the preferred embodiment, the bounce on Qvdd is substantially the same as the bounce on Qgnd if the Qvdd bounce is within 99% of the Qgnd bounce. Higher ratios of C1 to C2 in FIG. 3 can achieve >99% transfer if required. Lesser tolerance is possible depending on the sensitivity of the analog circuitry and the ability of other factors such as other means of noise isolation or immunization, discussed herewithin or otherwise, to compensate.

Figure 3:
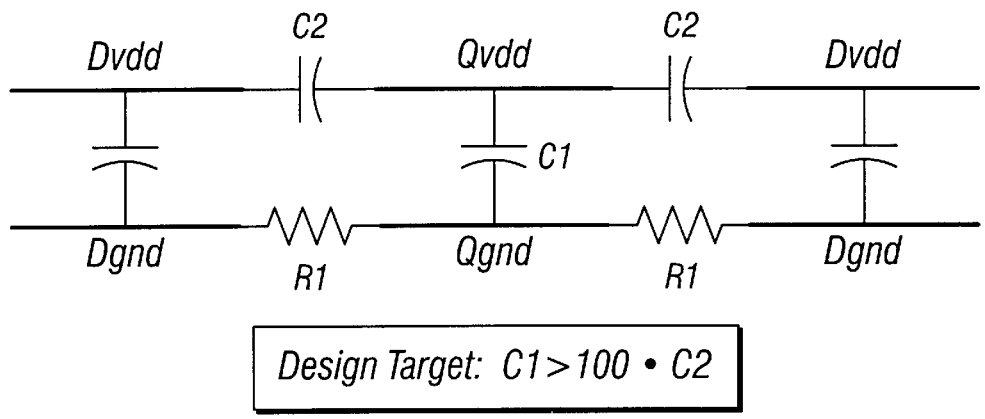
FIG. 3 shows a block diagram of the capacitive isolation of a noise effect suppression system according to an embodiment of the invention.

FIG. 3 shows a further simplified, lumped model of the noise effect suppression system of FIG. 2. Analog source rail Qvdd is coupled to analog ground rail Qgnd via capacitance C1. Analog source rail Qvdd is coupled to digital source rail Dvdd via capacitance C2. Digital source rail Dvdd is coupled to digital ground rail Dgnd via capacitance C3. Digital ground rail Dgnd is coupled to analog ground rail Qgnd via resistance R1.

In the preferred embodiment, the Qvdd rail is isolated from the Dvdd rail. This isolation is achieved in two ways. First, the noise isolation circuit 232 produces a constant current from Dvdd to Qvdd. Thus, voltage fluctuations on Dvdd can not impact the Qvdd rail through noise isolation circuit 232 through which Dvdd is coupled to Qvdd. Second, the Qvdd rail is physically distant from the Dvdd rail and separated from the Dvdd rail by a high impedance moat in the preferred embodiment. There is always some capacitive coupling between Qvdd and Dvdd (C2), but the C2 capacitance can be minimized, for example, by placing the two supply rails at a distance of about 2–3 micrometers. The C2 capacitance may be minimized further by placing the two supply rails at a distance of about 20 micrometers or more. Lesser distances are possible depending on the tolerance of the sensitive circuits.

Also in the preferred embodiment, the Qvdd rail is strongly coupled to the Qgnd rail. Although a capacitive coupling form rail to rail and from the Qvdd rail to the substrate exists, such capacitive coupling may be enhanced by using additional NMOS capacitors between the Qvdd and Qgnd rails. Ideally, the Qvdd-to-Qgnd capacitance C1 is greater than 100 times the Qvdd-to-Dvdd capacitance C2. The capacitive coupling between Qvdd and Dvdd is minimized by making the moat larger, and any parasitic coupling from Qvdd to Dvdd is made less important by increasing the analog Qvdd-to-Qgnd bypass capacitance. Although noise isolation circuit 232 may capacitively couple Qvdd and Dvdd (e.g., if a PMOS current source is used, the PMOS transistor has parasitic gate to drain and gate to source capacitances), NMOS capacitive coupling between Qvdd and Qgnd may be added to overcome this factor. In this way, noise voltages of the difference voltage from Dvdd to Dgnd are attenuated by a factor greater than 100 when coupled into the Qvdd node. (Note that the resistance R1 in FIG. 3 is small (<1 ohm) because the Qgnd and Dgnd rails are directly connected.)

Referring to FIGS. 1 and 3, the moat region has a blocking impedance large enough such that noise currents in the substrate flow around the moat. Nonetheless, a strong metal 1 strap connects Qgnd and Dgnd. This is not counter to the idea of the isolation because the moat prevents spurious currents in the substrate which create spatial voltage differences as the currents flow. Thus, all of Qgnd can be at the same potential. The metal strap between Qgnd and Dgnd sets the potential of Qgnd. Thus, if there is a 500 mV bounce at the point where Qgnd is strapped to Dgnd, the 500 mV bounce is mimicked by Qgnd. There is not 500 mV of noise in the analog region under these conditions because the Qvdd rail is capacitively coupled to the Qgnd rail. Thus, when a 500 mV bounce is seen on Qgnd, >99%, or >495 mV of the voltage bounce is seen on Qvdd. The actual bounce seen by analog circuits 110 is less than 1/100th of the original noise.

Analog circuits 110, like other circuits, have no ability to detect a common potential bounce on their supplies. All of the capacitances of analog circuits 110 either terminate on Qvdd or Qgnd. Because both of these supply rails bounce by substantially the same voltage, every capacitor divider bounces all of the intermediate nodes by that voltage as the capacitors strive to maintain the voltages across their terminals.

The requirement that all of the analog signals have their capacitances terminate only on the Qvdd and the Qgnd rails (see FIG. 4) is easy to meet for internal signals. Because interface signals inherently must leave the analog region and pass over moat 115, the number of interface signals are reduced where possible and are input and output differentially. Also, capacitive currents are eliminated to a first order by the complementary swings, and common-mode noise between the supply levels from the source and destination sides by is rejected by the differential signaling.

Figure 5:
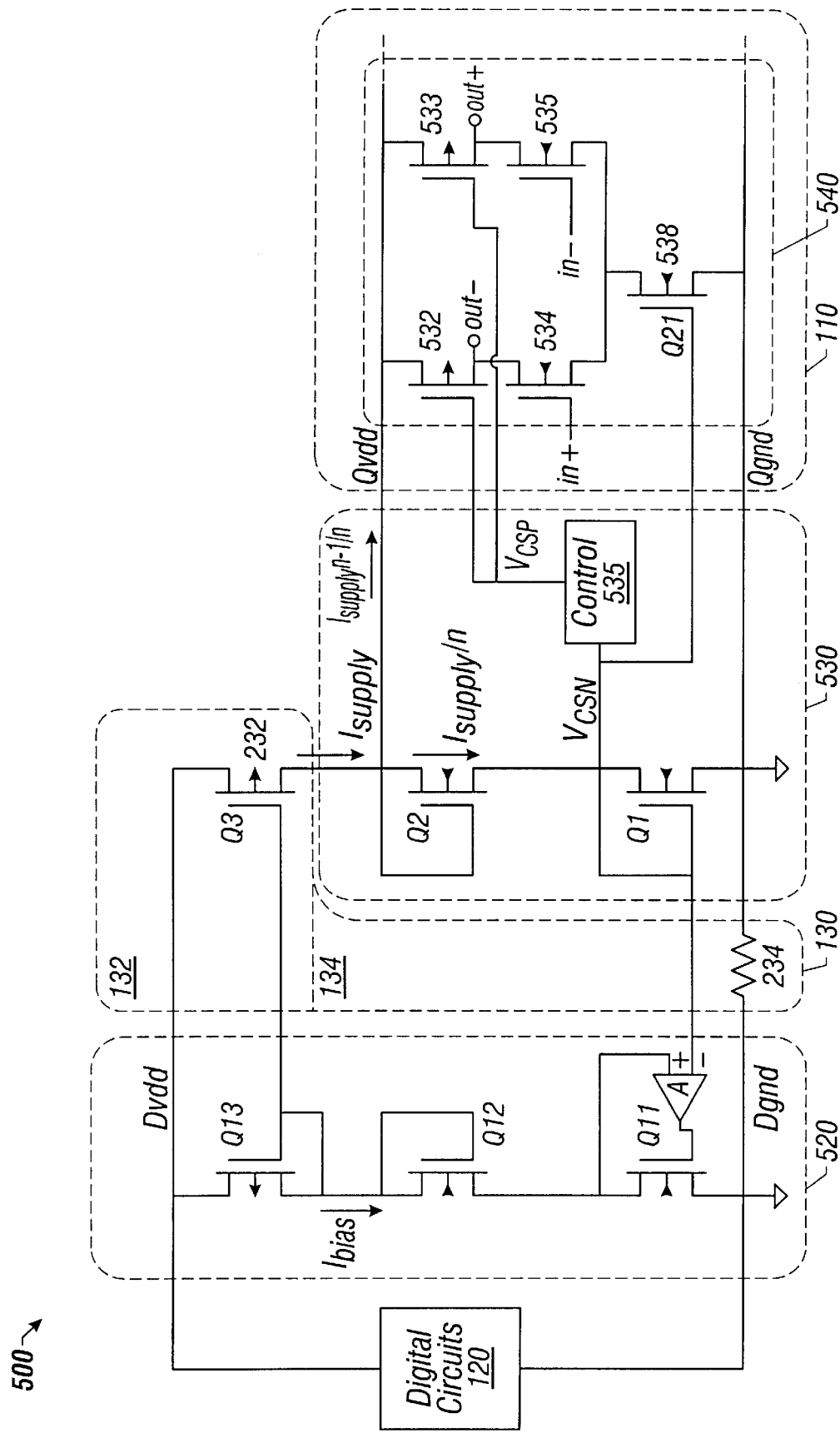
FIG. 5 shows a circuit diagram of a noise effect suppression system according to an embodiment of the invention.

FIG. 5 depicts a circuit diagram of an exemplary noise effect suppression system. Mixed signal circuit 500 includes analog circuits 110, digital circuits 120, noise effect suppression circuit 130 and bias circuits 520 and 530. Analog circuits 110 are coupled between analog source rail Qvdd and analog ground rail Qgnd. Digital circuits 120 are coupled between digital source rail Dvdd and digital ground rail Dgnd. Qvdd is coupled to Dvdd via source port 132 of noise effect suppression circuit 130. Qgnd is coupled to Dgnd via ground port 134 of noise effect suppression circuit 130. Source port 132 includes noise isolation circuit 232 which includes a PMOS transistor Q3 current source. Ground port 134 includes noise transference circuit 234 which includes a low resistance wire. Bias circuit 520 includes bias amplifier A and transistors Q13, Q12 and Q11. Bias circuit 530 includes bias transistors Q2 and Q1, control voltage generation circuit 535, and various analog circuits coupled between Qvdd and Qgnd such as differential inverter 540.

Regarding the transistors of the present embodiment, it is noted that a transistor may be conceptualized as having a control terminal which controls the flow of current between a first current handling terminal and a second current handling terminal. An appropriate condition on the control terminal causes a current to flow from/to the first current handling terminal and to/from the second current handling terminal. In a bipolar NPN transistor, the first current handling terminal is the collector, the control terminal is the base, and the second current handling terminal is the emitter. A sufficient current into the base causes a collector-to-emitter current to flow. In a bipolar PNP transistor, the first current handling terminal is the emitter, the control terminal is the base, and the second current handling terminal is the collector. A current exiting the base causes an emitter-to-collector current to flow.

A MOS transistor may likewise be conceptualized as having a control terminal which controls the flow of current between a first current handling terminal and a second current handling terminal. Although MOS transistors are frequently discussed as having a drain, a gate, and a source, in most such devices the drain is interchangeable with the source. This is because the layout and semiconductor processing of the transistor is symmetrical (which is typically not the case for bipolar transistors). For an N-channel MOS transistor, the current handling terminal normally residing at the higher voltage is customarily called the drain. The current handling terminal normally residing at the lower voltage is customarily called the source. A sufficient voltage on the gate causes a current to therefore flow from the drain to the source. The gate to source voltage referred to in an N channel MOS device equations merely refers to whichever diffusion (drain or source) has the lower voltage at any given time. For example, the "source" of an N channel device of a bi-directional CMOS transfer gate depends on which side of the transfer gate is at a lower voltage. To reflect the symmetry of most N channel MOS transistors, the control terminal is the gate, the first current handling terminal may be termed the "drain/source", and the second current handling terminal may be termed the "source/drain". Such a description is equally valid for a P channel MOS transistor, since the polarity between drain and source voltages, and the direction of current flow between drain and source, is not implied by such terminology. Alternatively, one current handling terminal may be arbitrarily deemed the "drain" and the other deemed the "source", with an implicit understanding that the two are not distinct, but interchangeable.

Bias circuit 530 includes transistors Q2 and Q1 for regulating the current from Qvdd to Qgnd. Analog circuits 110 include various functional analog circuits coupled between Qvdd and Qgnd (e.g., differential inverter 540). The drain voltage of Q1 determines an NMOS control voltage Vcsn that is used to set the current through various NMOS transistors located in the tails of the functional portions of analog circuits 110. Control circuit 535 receives the NMOS control line Vcsn and generates PMOS control line Vcsp. Exemplary differential inverter 540 includes PMOS transistors 532 and 533 and NMOS transistor 538 as current regulators, and functional NMOS transistors 534 and 535. PMOS transistors 532 and 533 are controlled by Vcsp, and NMOS transistor 538 is controlled by Vcsn. The current regulator transistors are sized so that the total current through differential inverter 540 is Ianalog/n.

Bias circuit 520 includes transistors Q13, Q12 and Q11 for regulating the current from Dvdd to Qvdd by setting the gate voltage of Q3. Amplifier A controls the gate of transistor Q11 so that Q11 and Q1 are both sourcing substantially the same drain current. Transistors Q13, Q12 and Q11 are sized so that Ibias is substantially equal to Isupply/n. Transistors Q13, Q12 and Q11 are sized according to the following proportions:

$$\frac{Q12}{Q2} = \frac{Q11}{Q1} = \frac{Q13 \cdot I_{Q2}}{Q3 \cdot I_{Q3}}$$

To configure the circuit of FIG. 5, the current required by analog circuits 110 is first determined. The analog block current estimate can be quite accurate if derived it by replication of the total tail currents in differential stages and if this is the only type of logic in the analog block. Although the estimate will not be as accurate if here is some CMOS type logic in analog circuits 110, a small error in the current is permissible because the finite output impedance of the PMOS current source allows for Qvdd to shift to compensate for any static error in the current.

Noise isolation circuit 232 not only sets the current flowing through the isolation source, but also sets the Vcsn master current source control voltage level. The voltage Vcsn is used to control NMOS current sources in analog circuits 110. All other currents in the analog section must be referenced off of the control voltage Vcsn so that the total current pulled by the analog section is Ianalog, the current from the PMOS current source 234 of noise isolation circuit 232.

Noise isolation circuit 232 uses PMOS transistors with gate lengths larger than minimum (e.g., 0.9–1.2 um in a normally 0.6 um process) in order to minimize the channel length modulation effect from creating a low impedance resistor between Dvdd and Qvdd. This small signal resistance will couple in the noise from Dvdd to Qvdd.

The bias levels for the PMOS current source transistor need to be such that the transistor is in the saturated region. Again, if the transistor is in the linear region, a small-signal resistor will in effect be connected from Dvdd to Qvdd. The control loop has negative feedback so that the PMOS current source transistor closes.

In the preferred embodiment, a constant current connection is used between the source rails and a constant voltage connection is used between the ground rails. This is useful in certain types of integrated circuit (IC) processes. For example, such a configuration of the noise isolation 130 is useful in a 0.6 micron CMOS (complementary metal-oxide semiconductor) process with a P-type substrate which shorts all grounds together through a medium impedance substrate resistance. In such a process, the constant voltage connection between the ground rails better hides the parasitic effects from the substrate connection. Because the ground bounces across the integrated circuit, the noisy and quite grounds are tied together, and the quiet source is capacitively tied to the ground. In other embodiments of the invention (e.g., in other process technologies), a constant voltage connection could be used between the source rails and a constant current connection could be used between the ground rails. Furthermore, although metal-oxide semiconductor (MOS) transistors are used in the above embodiment, the invention is applicable to other technologies such as metal semiconductor field-effect transistor (MESFET), Gallium-Arsenide (or other Group III/IV semiconductor), or bipolar implementations.

While the invention has been described with reference to various embodiments, it will be understood that these embodiments are illustrative and that the scope of the invention is not limited to them. Many variations, modifications, additions, and improvements of the embodiments described are possible. Those skilled in the art will recognize that circuit elements in circuit diagrams and boundaries between logic blocks are merely illustrative and that alternative embodiments may merge logic blocks or circuit elements or impose an alternate decomposition of functionality upon various logic blocks or circuit elements. For example, although bias circuits 520 and 530 and noise effect suppression circuit are characterized as being separate logic blocks in FIG. 5, such circuits may be characterized as being within a single noise effect suppression block. Additionally, any means of providing a current source from Dvdd to Qvdd may be employed. Moreover, alternative embodiments may combine multiple instances of a particular component. These and other variations, modifications, additions, and improvements may fall within the scope of the invention as defined in the claims which follow.

What is claimed is:

1. An apparatus for suppressing effects of noise from a first circuit on a second circuit, the first and second circuits on a common substrate, the first circuit including a first supply rail and a second supply rail, the second circuit including a third supply rail and a fourth supply rail, the apparatus comprising:

a noise isolation circuit coupled between the first supply rail and said third supply rail, the noise isolation circuit preventing noise on the first supply rail of the first circuit from transferring to the third supply rail of the second circuit; and a noise transference circuit coupled between the second supply rail and fourth supply rail so that noise on the second supply rail of the first circuit is transferred to the fourth supply rail of the second circuit.

2. The apparatus of claim 1 further comprising:

a capacitance coupled between the fourth and second supply rails of the second circuit to transfer voltage bounces on the fourth supply rail of the second circuit to the third supply rail of the second circuit so that circuit elements in the second circuit experience a common voltage bounce.

3. The apparatus of claim 1, wherein the noise transference circuit includes a low impedance connection so that the second supply rail fourth supply rail have substantially equal voltages.

4. The apparatus of claim 1, wherein the noise isolation circuit includes a current source for providing a current to the second circuit.

5. The apparatus of claim 4 wherein the current source of the noise isolation circuit is a transistor including a control terminal coupled to receive a control signal;

a first current handling terminal coupled to the first supply rail of the first circuit; and a second current handling terminal coupled to the third supply rail of the second circuit.

6. The apparatus of claim 5 further comprising:

a first bias circuit coupled to provide the control signal to the control terminal of the transistor of the noise isolation circuit; and a second bias circuit coupled to the noise isolation circuit and said second circuit, the second bias circuit being coupled to provide at least one control signal to the second circuit to regulate the current entering the second circuit from the noise isolation circuit.

7. The apparatus of claim 5, wherein the transistor is has a predetermined size to provide a predetermined amount of said current from the first circuit to the second circuit.

8. The apparatus of claim 5, wherein the transistor is a PMOS transistor having a size between 1.2 and 0.9 micrometers.

9. The apparatus of claim 5, wherein the first supply rails are source rails; and the second supply rails are ground rails.

10. The apparatus of claim 1, wherein the first circuit includes digital circuitry; and the second circuit includes analog circuitry.

11. The apparatus of claim 1 further comprising:

a high impedance noise isolation moat between the first and second circuits for isolating the second circuit from noise from the common substrate, the noise isolation circuit coupling between the first supply rail and the initial supply rail of the first and second circuits over the moat, and the noise transference circuit coupling the second supply rails and the fourth supple rail of the first and second circuits over the moat.

the second circuit includes analog circuitry.

12. An integrated circuit comprising:

a first reference node;

a second reference node;

a third reference node;

a fourth reference node;

a first circuit coupled between the first and second reference nodes;

a second circuit coupled between the third and fourth reference nodes, the second circuit wherein the third and fourth reference nodes are capacitively coupled to transfer noise from the fourth reference node to the third reference node;

a third circuit coupled between the first and third reference nodes to prevent noise from the first reference node from transferring to the third reference node; and a fourth circuit coupled between the second and fourth reference nodes to transfer noise on the second reference node to the fourth reference node.

13. The integrated circuit of claim 12, wherein the first circuit includes digital circuitry;

the first and second reference nodes are first supply rails for the digital circuitry;

the second circuit includes analog circuitry;

the third and fourth reference nodes are second supply rails for the digital circuitry.

14. The integrated circuit of claim 13, wherein the first reference node is a first source rail for the digital circuitry;

the second reference node is a first ground rail for the digital circuitry;

the third reference node is an second source rail for the analog circuitry;

the fourth reference node is an second ground rail for the analog circuitry.

15. The integrated circuit of claim 14, wherein the third circuit includes a current source coupled to provide a first current from the first source rail to the second source rail;

the fourth circuit includes a low impedance connection.

16. The integrated circuit of claim 15, further comprising:

a fifth circuit coupled between the first and second reference nodes for generating a first control signal to determine an amount of the first current, the first control signal being generated so that the amount of the first current equals an amount of current required by the second circuit; and a sixth circuit coupled between the second and fourth reference nodes for generating at least a second control signal, at least the second control signal coupled to the second circuit to regulate an amount of current flowing from the second node to the fourth node through the second circuit.

17. The integrated circuit of claim 12 further comprising:

a high impedance moat for isolating the second circuit from substrate noise, the third circuit coupled between the first and third reference nodes across the moat, the fourth circuit coupled between the second and fourth reference nodes across the moat.

18. A method for suppressing effects of noise from a first circuit on a second circuit, the method comprising:

providing the first and second circuits on a common substrate;

providing a noise isolation circuit on the common substrate, the noise isolation circuit coupling a first supply rail of the first circuit and a third supply rail of the second circuit to prevent noise on the first supply rail of the first circuit from transferring to the third supply rail of the second circuit; and providing a noise transference circuit on the common substrate, the noise transference circuit coupling a second supply rail of the first circuit and a fourth supply rail of the second circuits so that noise on the second supply rail of the first circuit is transferred to the fourth supply rail of the second circuit.

19. The method of claim 18 further comprising:

providing a high impedance moat between the second circuit and the first circuit to isolate the second circuit from noise in the common substrate;

coupling the first supply rail and the third supply rail of the first and second circuits via the noise isolation circuit over the moat; and coupling the second supply rail and the fourth supple rail of the first and second circuits via the noise transference circuit over the moat.

20. The method of claim 18 further comprising:

providing a capacitance between the third and fourth supply rails of the second circuit to transfer voltage bounces on the fourth supply rail of the second circuit to the third supply rail of the second circuit.

21. The method of claim 18, wherein the noise isolation circuit includes a current source for providing current from the first circuit to the second circuit; and the noise transference circuit includes a low impedance connection so that the second supply rail and the fourth supply rail have substantially equal voltages.

22. The method of claim 21 wherein the current source of the noise isolation circuit is a transistor including a control terminal coupled to receive a control signal;

a first current handling terminal coupled to the first supply rail of the first circuit; and a second current handling terminal coupled to the third supply rail of the second circuit.

23. The method of claim 22 further comprising:

providing a first bias circuit and a second bias circuit;

coupling the first bias circuit to provide the control signal to the control terminal of the transistor of the noise isolation circuit; and coupling the second bias circuit to the noise isolation circuit and the second circuit to regulate the current entering the second circuit from the noise isolation circuit.

24. The method of claim 22, wherein the transistor has a predetermined size to provide a predetermined amount of current from the first circuit to the second circuit.

25. The method of claim 22, wherein the transistor is a PMOS transistor having a size between 1.2 and 0.9 micrometers.

26. The method of claim 18, wherein the first supply rail and the third supply rail are source rails; and the second supply rail and the fourth supply rail are ground rails.

27. The method of claim 18, wherein the first circuit includes digital circuitry; and the second circuit includes analog circuitry.

* * * * *

UNITED STATES PATENT AND TRADEMARK OFFICE
CERTIFICATE OF CORRECTION

PATENT NO. : 6,031,406
ISSUE DATE : 02/29/00
INVENTOR(S) : Bosnyak, Robert J.; Cruz, Jose M.; Drost, Robert J.

It is certified that error appears in the above-identified patent and that said Letters Patent is hereby corrected as shown below:

Col. 11, line 56, delete "supple" and insert –supply–.
Col. 13, line 8, delete "supple" and insert –supply–.

Signed and Sealed this

Third Day of April, 2001

Attest:

NICHOLAS P. GODICI

Attesting Officer     Acting Director of the United States Patent and Trademark Office